March 10, 1970 F. FORLANI ET AL 3,500,448

VOLTAGE THRESHOLD PHOTODIODE AND CIRCUIT ASSEMBLY COMPRISING THE SAME

Filed Oct. 26, 1965 2 Sheets-Sheet 1

United States Patent Office 3,500,448
Patented Mar. 10, 1970

3,500,448
VOLTAGE THRESHOLD PHOTODIODE AND CIRCUIT ASSEMBLY COMPRISING THE SAME

Franco Forlani, Rho, Milano, and Nicola Minnaja, Milan, Italy, assignors to Olivetti-General Electric S.p.A., Caluso, Torino, Italy, a corporation of Italy
Filed Oct. 26, 1965, Ser. No. 505,274
Claims priority, application Italy, Oct. 30, 1964, 23,674/64
Int. Cl. H01j 39/12
U.S. Cl. 250—211 7 Claims

ABSTRACT OF THE DISCLOSURE

A solid state photoelectric device comprising a semiconductor and a metal layer having an insulating layer interposed therebetween is disclosed, which shows light responsiveness only if negatively biased with an applied voltage up to a threshold voltage.

This invention relates to a diode, having an electric layer interposed between a semiconductor layer and a metallic layer of the type described in the pending patent application No. 407,407 filed Oct. 29, 1964, now abandoned.

The photodiodes known in the prior art are sensitive to the illumination for every value of the inverse voltage applied, and therefore, when illuminated, are made conductive to both direct and inverse current.

By reason of these characteristics, their application in many instances is neither possible or convenient.

One object of the present invention is to provide a photodiode having a threshold value of photoelectrical sensitivity. This is obtained, according to a feature of the invention, by means of an accumulation layer of majority carriers which exists in the surface region of the semiconductor near the dielectric, with no voltage applied. Therefore, the resisatnce and the capacitance of the diode are sensitive, or insensitive, to illumination, according to whether the inverse voltage applied is higher or less than a determined threshold value.

The invention is based on the discovery of new photoelectrical properties of the diode, according to the primary application, and, more particularly, on the discovery that in such diode, the resistance and capacitance are sensitive to light, whereby the invention provides means for constructing a photodiode which offers the remarkable advantages of the diode described in the aforesaid pending patent application.

Furthermore, the invention is based on the discovery that the sensitivity to the illumination of such diode according to the aforesaid pending patent application, takes place only for inverse voltage values higher, in absolute value, than a threshold value, therefore the aforesaid photodiode offers further advantages over photodiodes not constructed according to the said pending patent application.

In addition, a further object of the invention is to disclose novel industrial applications of said photoelectrical properties, by embodying said diode in proper circuits.

Other objects and features of the invention will appear more fully and clearly from the following description of an illustrative embodiment thereof, when taken with the appended drawings in which.

Figure 5A:
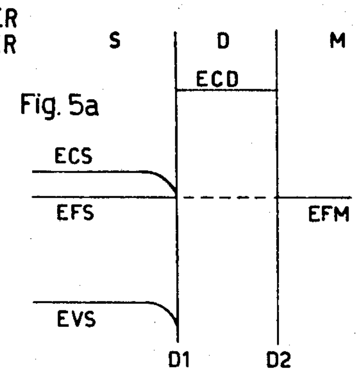
Figure 5B:
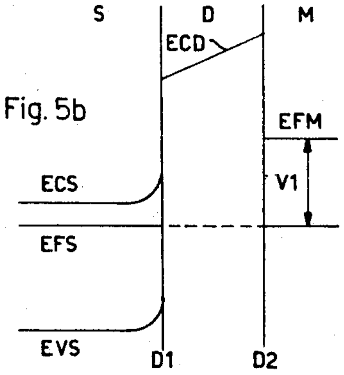
Figure 5C:
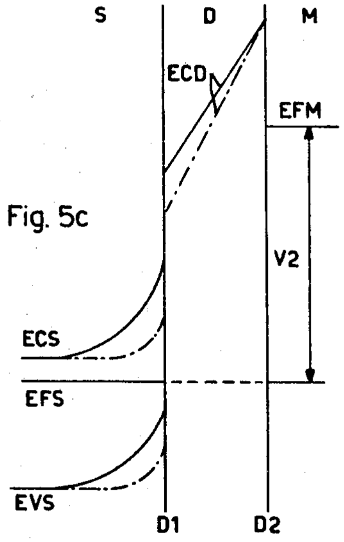

FIGS. 5*a*, 5*b*, 5*c* show a schematical diagram of energy levels of said diode under different conditions.

Figure 6:
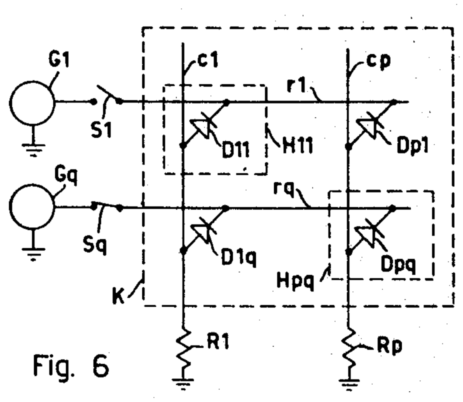
Figure 7A:
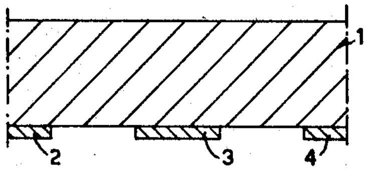
Figure 7B:
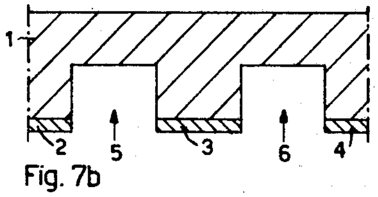
Figure 7C:
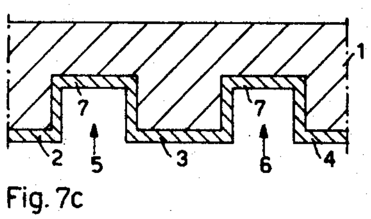
Figure 7D:
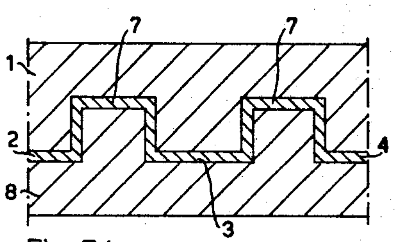
Figure 7E:
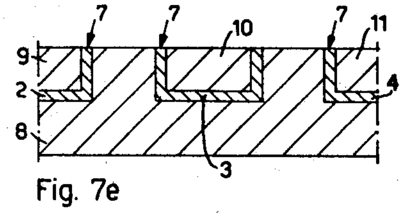
Figure 7F:
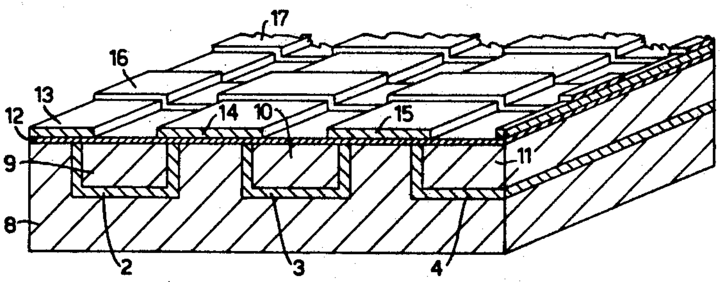

FIG. 6 shows a matrix of said diodes.

FIGS. 7*a* to 7*f* illustrate a process for fabricating matrices of said diodes.

Figure 8:
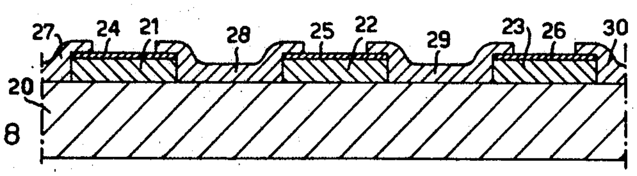

FIG. 8 illustrates another fabricating process of a matrix according to the invention.

Figure 1:
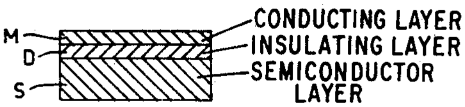
FIG. 1 shows in a schematic way the structure of the diode according to the invention.

As has been described in the aforesaid pending patent application, with reference to FIG. 1, an insulating layer D, for example silicon dioxide, is interposed between a semiconductor layer S, for instance N-type silicon, and a conducting layer M, for instance aluminum. Both external layers M and S are provided with connecting terminals providing a low resistance contact with said layers. Said terminals will be called respectively positive and negative terminals.

Figure 2:
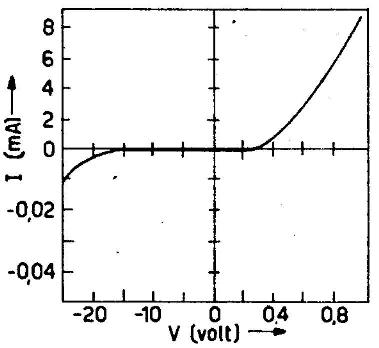
FIG. 2 shows a characteristic curve of the voltage versus current, of the diode according to the invention.

In darkness, the diode shows a voltage-current characteristic of the same type as shown in FIG. 2, which was discussed in the said pending patent application.

When illuminated, the voltage current characteristic remains practically unchanged for varying intensity of light in the entire region of positive applied voltage, and also in the region of negative applied voltage up to a threshold negative voltage, of value $V_S$. For negative voltages higher, in absolute value, than said threshold value, the current is greatly influenced by the light, and increases for increasing illumination values. The threshold voltage for the photo electrical sensitivity appears to be, in the examined specimens, approximately equal to 1.5 volts.

Figure 3:
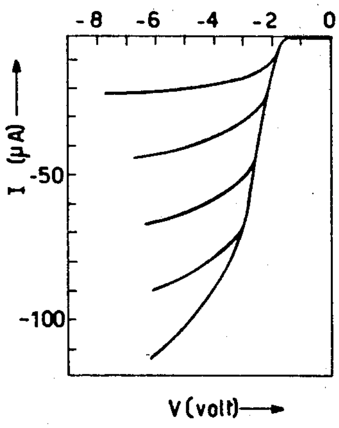
FIG. 3 shows a family of characteristic voltage current curves for different illumination values, of said diode.

The effect of light on the inverse characteristic of the said diode is clearly shown in FIG. 3, which represents the variation of the inverse current as a function of the applied inverse voltage for different values of illumination.

Furthermore, a similar effect of the light on the capacitance of the diode has been discovered. More specifically the voltage-capacitance characteristic of the diode is, in darkness, of the type as shown in FIG. 4 by the solid line, and has been discussed in the pending patent application.

When illuminated, the aforesaid voltage-capacitance characteristic remains practically unchanged, for varying intensity of light, in the region of applied negative voltage up to the aforesaid negative threshold voltage $V_S$, while for applied negative voltage, higher, in absolute value, than said threshold value, the capacitance is strongly influenced by the light, increasing when the illumination increases.

Figure 4:
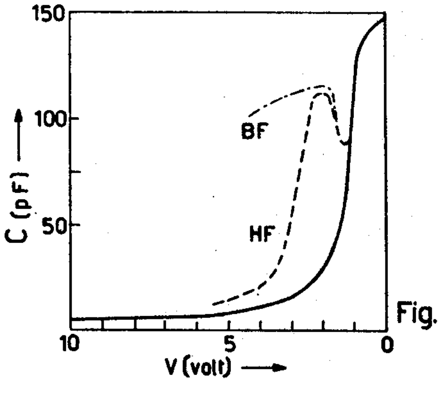
FIG. 4 shows some characteristic voltage-capacitance curves for different values of illumination of said diode.

In particular, in FIG. 4 the line BF relates to the capacitance measured at low frequency (appr. 10 kHz.) for a given illumination value, and the curve HF relates to the capacitance measured at high frequency (appr. 1 mHz.), for the same illumination value.

Such behaviour of the diode can be explained as follows:

FIGS. 5*a*, 5*b* and 5*c* represent, in a graphic manner, the diagram of the energy levels in the diode, under different conditions. In particular, lines $D_1$ and $D_2$ represent the surfaces of the intermediate insulating layer D; lines ECS and EVS indicate respectively the lower limit of the conduction band and the upper limit of the valence band of semiconductor S. Line ECD represents the lower limit of the conduction band of dielectric D; lines EFS and EFM represent the Fermi levels respectively in the semiconductor S and in the metal M.

When no external voltage is applied, the diagram of the energy levels is of the type graphically represented in FIG. 5*a*. In particular, the Fermi levels EFS and EFM of semiconductor S and of metal M, respectively, coincide, and in the surface region of the semiconductor S near the interface $D_1$, limits ECS and EVS respectively of the valence and conduction band are curved downward, because in said surface region there is an accumulation layer of majority charge carriers. For example, in case the semiconductor is of N type, the charge carriers are electrons.

If the diode is negatively biased by applying a negative voltage between the terminals, the Fermi level EFM of the metal M is raised with respect to the Fermi level EFS of the semiconductor S, by a quantity corresponding to the applied voltage, whereas the electron accumulation layer is deprived of electrons. Therefore the curvature of the limits ECS and EVS of the energy bands in the surface regions decreases.

As the absolute value of the negative applied voltage increases, the surface accumulation layer is further deprived of electrons, and tends to become an electron depletion layer. Therefore the limits ECS and EVS of the energy bands in the semiconductor are curved upward. Such a situation is schematically represented in FIG. 5*b*, corresponding to a negative applied voltage equal to $V_1$.

The electrons which occupy the conduction band of Metal M are able to pass, by tunnel effect, into the insulating layer D, through the potential barrier present on interface $D_2$, and can reach the semiconductor S under the action of the electrical field established in the insulating layer by the application of the external potential $V_1$. As a result an inverse current takes place through the diode.

For rendering possible the passage of electrons by tunnel effect, it is necessary to have empty energy levels beyond the potential barrier, and at the same level as the levels occupied in metal M by the electrons. Furthermore, the path that said electrons should cover should be so short, that the tunnelling probability may be sufficiently high. The length of such path, which the electrons occupying the different energy levels of the conduction band of metal M must travel, is greater for the lower energy levels, and is represented (FIG. 5), by the length of the horizontal segment comprised between interface $D_2$ and the lower limit ECD of the conduction band on insulating layer D. This distance is the width of the barrier that the tunnelling electrons must traverse. It is clear that, for each energy level, the said width diminishes when the absolute value of the externally applied voltage $V_1$ increases, as the inclination of the lower limit AED of the conduction band of insulating layer D increases.

By further increasing the absolute value of the inverse applied tension, the inclination of the lower limit ECD of the conduction band of the insulating layer D, increases proportionately and the upward curvature of the limits ECS and EVS of the conduction band increase with reference to the valence band of the surface region of semiconductor S near interface $D_1$. This latter effect is due to the progressive electron depletion in the said surface region.

When the absolute value of the inverse voltage is further increased, a layer of inversion of the type of conductivity takes place in the said surface region so that if the semiconductor was of the N-type, the said inversion layer changes to the P-type.

Such an inversion layer occupies the region formed between the interface $D_1$ and the plane, parallel to said interface, which passes through the point of intersection of the intrinsic Fermi level of the semiconductor S (line equidistant from band limits ECS and EVS) with the Fermi level of the bulk of the semiconductor S. FIG. 5*c* schematically represents such a situation, caused by an external voltage $V_2$. However, the quantity of the electrons which can pass, by tunnel effect from the metal M to the conduction band of the insulating layer D, although increasing from condition of FIG. 5*a* to the one of FIGS. 5*b* and 5*c*, is always very small, because the thickness of the barrier to be traversed by the tunneling electrons is always very great.

In effect, as is pointed out in the aforesaid pending patent application, the formation, at first, of a surface layer of electron depletion, and, subsequently, of a layer of conductivity-type inversion, causes, as the absolute value of the inverse applied voltage increases, considerable potential drop in semiconductor S near interface D. Therefore a substantial part of the total voltage drop V through the diode takes place in the semiconductor near interface $D_1$, and as a result the voltage drop across the insulating layer D is but one fraction of the total applied voltage. In other words, by reason of the upward bending of the band limits ECS and EVS, the slope of the lower limit ECD of the conduction band in the insulating layer is always very small, and in consequence the potential barrier to be traversed by the tunnelling electrons is always very thick.

For the aforesaid reasons, the inverse current of the diode is always very small, until large absolute values of the applied inverse voltage are reached, that is values of about 20 v., and therefore much higher than the values considered in FIGS. 5*b* and 5*c*.

In fact, as explained in the said prior patent application, the inverse current, by increasing inverse applied voltage, is practically null for a long interval, and afterwards increases very rapidly with the characteristics of disruptive conduction.

In addition, the preceding observations also explain the diminution of the diode capacitance with the increase of the absolute value of the inverse applied voltage.

In particular, if the band limits ECS and EVS were not curved near interface $D_1$, the diode capacitance would substantially coincide with the capacitance of a dielectric layer, equal to the insulating layer D, formed between two plane electrodes.

More generally, the total capacitance of the diode may be represented by a fixed capacitance equal to the capacitance pertaining to the insulating layer D, series connected to a variable capacitance due to the space-charge surface region existing in the semiconductor near interface $D_1$. As the absolute value of inverse applied voltage increases, said surface region changes, due to a very small variation of said applied voltage, from an accumulation layer to a depletion layer and then to an inversion layer.

Correspondingly, as is known, said partial capacitance diminishes abruptly, passing from the condition of FIG. 5*a* (no applied voltage, bands limits ECS and EVS curved downward) to the condition of FIG. 5*b* (small inverse voltage $V_1$, band limits ECS and EVS curved upward), to reach an approximately constant value as the condition of FIG. 5*c* is reached (applied inverse voltage $V_2$, greater than $V_1$, formation of an inversion surface layer in the semiconductor S), therefore the total capacitance goes down abruptly to a very low value, as shown by the solid line of FIG. 4. This behavior is obtained when the diode is in darkness.

Suppose now the diode is illuminated. As long as the inverse applied voltage is lower, in absolute value than the voltage $V_s$, which causes the formation of a surface electron depletion layer in the semiconductor, that is, as long as the band limits ECS and EVS does not begin to curve upward, inverse current does not depend upon illumination, because the electron-hole pairs have no appreciable influence either on the electric field intensity on the interface metal-semiconductor. This hypothesis is confirmed by the independence of the capacitance from illumination, by inverse applied voltage lower than $V_s$.

In fact, in darkness, the inversion layer is not really present, because the bulk of the semiconductor, being of the extrinsic (nondegenerate) type, is unable to deliver a sufficient quantity of holes; and, in addition, because a hole equilibrium between metallic and semiconductor layer cannot take place, the said layers being separated by the insulating layer.

Illumination has the effect of stimulating the equilibrium between valence band and conduction band in the semiconductor, by creating a concentration of free charges near the interface semiconductor dielectric $D_1$, therefore generating an effective inversion layer. The observed increase of the capacitance with illumination confirms this hypothesis. Said concentration of free charges influence the distribution of the electric field intensity in such a way, as to diminish the upward curvature of the band limits EPS and ECS. Therefore the total potential drop across the diode takes place almost wholly in the dielectric.

The effect of illumination on the energy band is graphically represented in FIG. 5*c*, where the solid lines relate to applied voltage $V_s$, in the dark, while the dash-and-dot lines relate to the same applied voltage with an illuminated diode.

In particular, the slope of the lower limit ECD of the conduction band in the dielectric increases with the illumination, and therefore decreases the width of the barrier that the electrons, tunnelling from metal S to insulating layer D, must traverse. In this manner it is explained that, for equal inverse applied voltage, the inverse current increases by increasing illumination, provided the voltage is higher than a threshold value.

It is moreover clear that, by constant illumination, the increase of the inverse current by increasing applied inverse voltage is, for the aforesaid reasons, very rapid initially, but thereafter it becomes slower, because, as the free charge concentration in semiconductor S near the interface $D_1$ is limited by the fact that the illumination value is constant, the effect of the upward curvature of the band limits ECS and EVS can show up.

The trend of the single curves of the family of curves represented in FIGURE 3 is therefore explained.

The design criteria of the device semiconductor-dielectric-conductor, have been disclosed in the aforesaid pending patent application. In order to obtain the said photoelectrical properties it is necessary to fulfill some supplementary condition.

In particular, it is necessary to have, in the surface regon of semiconductor S near the interface $D_1$, an accumulation layer, that is the concentration of majority charge carriers must be greater in this surface region than in the remaining part of the semiconductor, in order to obtain a threshold value separating a region of insensitiveness from a region of sensitiveness to illumination.

As is known, such a condition is fulfilled in the structure silicon-silicon oxide-metal, at the time the silicon oxide is thermally grown.

Furthermore, the height of the forbidden energy band of the semiconductor must be smaller than the energy of the incident photons, in order to allow the generation of pairs of electrons and holes in the semiconductor. In addition, it is necessary that the metallic layer be transparent to light, in order that the light may reach the interface $D_1$, therefore, the thickness of the metallic layer should be conveniently small.

The most important photoelectric property discovered in the described diode is the existence of a threshold voltage $V_s$, separating a region of sensitivity to the light, from one of substantial insensibility to the light.

The fact, that the inverse current is practically zero for an applied inverse voltage lower in absolute value than the said threshold value, and that said inverse current increases considerably by increasing illumination, for inverse applied voltages higher than said threshold value, permits the use of the diode in decoding matrices or in semipermanent memory matrices.

In particular a matrix according to the invention, comprises (FIG. 6) *p* columns from *c*1 to *cp* and *q* rows from *r*1 to *rq*. Each row and each column comprise a conductor indicated with the same symbol.

Each column from *c*1 to *cp* is connected to an electrical load represented respectively by a resistor R1 to R*p*.

Each row from *r*1 to *rp* can be connected, through a respectively related switch S1 to S*q*, to a voltage generator respectively G1 to G*q*, each one of them being able to deliver an equal positive voltage in respect to earth, said voltage being of value conveniently chosen between the threshold value $V_s$ and the double of said value.

Each row conductor is connected to each column conductor through a diode of the type previously described, having the positive and negative terminals connected respectively to the said row and column conductor.

The diode connected to the *n*th column and the *m*th row is indicated by D*nm*.

An opaque card K is interposed between a light source, not shown in the figure, and the diode matrix. The said card is perforated in correspondence with the selected crossing points of some rows with some columns in such a way, that only the diodes located at the said selected crossing points are illuminated. For example in FIG. 6 the card K has a hole H11 at the crossing of the first row with the first column, to illuminate the diode D11 and a hole H*pq* at the crossing of the *p*th column with the *q*th row, illuminating diode D*pq*. The operation of the matrix is such that, when the switch S*n* of a row *rn* is closed, the generator G*n* of said row feeds the loads R1 . . . R*p*, and only those, which are connected through illuminated diodes. Suppose now that switch S*q* is closed and switch S1 is open. Under such conditions the terminal of the diodes D1*q* and D*pq* connected to the row corresponding to a closed switch assume the voltage +V*g*. As the diode D1*q* is not illuminated, and therefore does not conduct inverse current, there is no current in the load R1.

Contrariwise the illuminated diode D*pq* is able to allow a strong inverse current to pass, because the inverse applied voltage V*g* is higher than the photoelectric threshold value. Therefore the load R*p* carries a current equal approximately to $(Vp-Vs)/rp$, as the inverse resistance of the illuminated diode, for voltages higher than the threshold value $V_s$, is negligible.

If the diodes of the matrix were conventional diodes, which do not present a photoelectric threshold voltage value, and which, for this reason, also have, when illuminated, a low inverse resistance at values of inverse voltage near to zero, an unwanted current path could be formed in the matrices as, for example, the path formed by Generator G*q*, switch S*q*, row *rq*, load R1; and as a result the load R1 would be unduly fed. On the other hand, in a matrix according to the invention, the said load does not carry current, because such a current, traversing both illuminated diodes D*pq* and D11, series connected, would cause a voltage drop not less than twice the threshold value $V_s$, and therefore greater than the voltage V*g* which is delivered by the generator G*q*.

It is therefore clear that the operation of said matrix can be obtained only by using diodes according to the present invention, and cannot be obtained by exclusively using photodiodes according to the prior art. Such operation could be obtained substituting for every diode, in FIG. 6, a photoresistance, series connected with a non-photoconductor diode, having the polarities inverted with respect to those of FIG. 6, said non-photoconducting diodes having the object of blocking undesired current paths.

It is however clear that the matrix in FIG. 6 results in a considerable reduced number of components. Moreover, according to an additional object of the invention, the matrix according to FIG. 6 may lend itself to be fabricated as an integrated circuit. A method of fabrication of the matrix is as follows:

Initially (FIG. 7*a*) silicon dioxide strips 2, 3, 4 are thermally grown on a face of a plate 1 cut from an extrinsic semiconductor silicon monocrystal, for example, of type N. These strips extend over the whole length of said face, perpendicularly to the sectional view of FIG. 7*a*. The localized growing of silicon dioxide is obtained by masking and photoengraving techniques already known in the art. Subsequently, said face (FIG. 7*b*) is etched by gaseous hydrochloric acid, or by phrocatechine and hydrazine hydrate, with the object of removing the silicon from the strips not protected by the oxide. Approximately rectangular grooves are thereby obtained on the plate surface, these grooves extending for the whole length of the plate, perpendicularly to the sectional view of FIG. 7*b*.

As a next step, (FIG. 7*c*) a layer 7 of silicon-dioxide is grown on the whole face of the plate. This is obtained by pyrolytical deposition at a temperature between 300° and 400° C., in such a way, as to prevent the dioxide from also growing on the already existing dioxide strips 2, 3, 4. This has the object of preventing the formation of a layer of oxide thicker than 2 microns which could crack by reason of different thermal dilatation in respect to the silicon.

As a following step (FIG. 7*d*), an epitaxial layer 8 of silicon is grown, on said face, as the underlying layer of dioxide is polycrystalline, this epitaxial layer will also be polycrystalline.

As a next step (FIG. 7*e*) the face of the plate opposite to the one treated before is mechanically lapped until the epitaxial polycrystalline silicon layer, which fills the grooves 5, 6 is uncovered. As a result a plate is obtained, which is mainly formed by epitaxial polycrystalline silicon 8, carrying longitudinal bars 9, 10, 11 of monocrystalline silicon, residual from the original monocrystal, and separated from the epitaxial material 8 by a layer 7 of silicon dioxide.

As a next step, (FIG. 7*f*) a layer 12 of silicon monoxide is thermally grown on the lapped surface.

As a following step (FIG. 7*f*) strips 13, 14, 15 of silicon monoxide are deposited on dioxide layer 12, in such a way, that corresponding strips of said layer, of sharply defined width, are left uncovered.

In an alternative method, said strips 13, 14 and 15 may be formed by silicon dioxide thermally grown, before layer 12 is grown. Subsequently (FIG. 7*f*), aluminum strips 16, 17 18 are formed by vapor deposition in vacuum. The silicon strips 9, 10, 11; the silicon dioxide layer 12, and the aluminum strips 16, 17 form, in each region where they cross each other, a diode with three layers S, D, M, according to FIG. 1.

Moreover, it is clear that the aluminum strips 16, 17 and the silicon strips 9, 10, 11 are adapted to form, at the same time, respectively said column and said row conductors.

According to another fabrication method (FIG. 8) on a substrate 20 of dielectric monocrystalline material, for example sapphire, strips 21, 22, 23 of epitaxial monocrystalline silicon are grown. On said strips, subsequently, by thermal or anodic process, a layer 24, 25, 26 of silicon dioxide is grown, strips 27, 28, 29, 30 of a silicon monoxide being thereafter deposited by vacuum evaporation, in such a way, as to leave sharply defined uncovered silicon dioxide strips. Afterwards, transverse strips of aluminum are deposited. The silicon strips 21, 22, 23 the dioxide silicon layers 24, 25, 26 and the aluminum strips, not shown in the figure, form, in each region where they cross each other, a three-layer diode, according to FIG. 1. It may be noted that the silicon monoxide strips 27, 28, 29, 30, by covering the edges of dioxide strips 24, 25, 26 prevent the unfavorable effects of the electric field concentration of the said edges.

It will be understood that various modifications may be made in the specific embodiment shown and described, without departing from the scope and spirit of this invention.

What is claimed is:

1. A photoelectric translating device comprising, a conducting layer, a semiconductor layer, and a substantially uniform insulating layer interposed between and contacting said conducting layer and said semiconductor layer, the combined thickess of the conducting layer and the insulating layer providing substantial transparency to a preferred range of radiation, separate low resistance contacts to said conductor layer and said semiconductor layer, means for applying a voltage between said contacts, and means for permitting irradiation of a portion of said semiconductor layer contacting said insulating layer, said semiconductor layer and said insulating layer having an accumulation of majority charge carriers at the surface region of said semiconductor layer contacting said insulating layer upon applying a null voltage, and said photoelectric translating device exhibiting sensitiveness to said radiations only for inverse voltage applied to its contacts, which exceed a negative threshold value.

2. A photoelectric translating device as claimed in claim 1 in which, said conducting layer is an aluminum layer, said semiconductor layer is a semiconductive silicon layer, and said substantially uniform insulator layer is a silicon dioxide layer.

3. A photoelectric translating device comprising, a conducting layer, a semiconductor layer, and a substantially uniform insulating layer interposed between and contacting said conducting layer and said semiconductor layer and having a thickness not exceeding the mean free path of the electron before trapping therein nor the value 300 $\sqrt{\phi_S - X_D}$, $\phi_S$ being the work function of said semiconductor measured in volts, $X_D$ being the electron affinity of said insulator measured in volts and said thickness being measured in angstroms, the combined thickness of said conducting layer and said insulating layer providing a transparency of said combined layers to a preferred range of radiation, separate low resistance contacts to said conducting layer and said semiconductor layer, means for applying a voltage between said contacts, and means for irradiating a portion of said semiconductor layer contacting said insulating layer, said semiconductor layer and said insulator layer having an accumulation of majority charge carriers at the surface region of said semiconductor layer contacting said insulator layer upon applying a null voltage, and said photoelectric translating device exhibiting sensitiveness to said radiations only for inverse voltage, applied to its contacts, which exceeds a negative threshold value.

4. A photoelectric translating device as claimed in claim 3 in which said semiconductor layer is non-degenerate.

5. A photoelectric translating device as claimed in claim 3 in which, said conducting layer is an aluminum layer, said semiconductor layer is a semiconductor silicon layer, and said substantially uniform insulator layer is a silicon dioxide layer.

6. A photoelectric translating matrix comprising, a first plurality of parallel strips of conducting material, a second plurality of strips of semiconductive material substantially perpendicular to the strips of said first plurality, and an insulating layer interposed between and contacting said conducting strips and said semiconductor strips, the combined thickness of the conducting strips and the insulating layer forming a substantial transparency of said strips and layer combined to a preferred range of radiation, separate low resistance contacts to each of said first and second plurality of strips respectively, means for applying a suitable voltage between said contacts, and means for irradiating selected regions of said matrix, located at the crossing of said first and second plurality of strips, said semiconductor strips and said insulator layer having an accumulation of majority charge carriers at the surface region of said semiconductor strips contacting said insulating layer upon applying a null voltage, and said photoelectric translating matrix exhibiting sensitiveness to the radiations only for inverse voltage applied to its contacts which exceeds a negative threshold value.

7. A photoelectric translating matrix, comprising a first plurality of parallel strips of conducting material, a second plurality of strips of semiconductive material, substantially perpendicular to the strips of said first plurality, an insulating layer interposed between and contacting said conducting strips and said semiconductor strips, the combined thicnkess of the conducting strips and the insulating layer forming a substantial transparency of said strips and layer combined together to a preferred range of radiation, separate low resistance contacts individually associated with each one of said strips in said first and second plurality, means for selectively applying a suitable voltage to said contacts, and means for irradiating selected regions of said matrix, located at the crossing of said first and second plurality of strips, said semiconductor strips and said insulator layer having an accumulation of majority charge carriers at the surface region of said semiconductor strips contacting said insulating layer upon applying a null voltage, and said photoelectric translating matrix exhibiting sensitiveness to the said radiations only for inverse voltage applied to the contacts associated with said regions which exceeds a negative threshold value.

References Cited

UNITED STATES PATENTS

| | | | |
|---|---|---|---|
| 2,998,530 | 8/1961 | Marshall ----------- | 250—208 |
| 3,116,427 | 12/1963 | Giaver. | |
| 3,191,040 | 6/1965 | Critchlow. | |
| 3,204,159 | 8/1965 | Bramley et al. | |
| 3,284,241 | 11/1966 | Lasser et al. | |
| 3,329,823 | 7/1967 | Handy et al. | |
| 3,341,826 | 9/1967 | Lee. | |

WALTER STOLWEIN, Primary Examiner

U.S. Cl. X.R.

317—235